(12) United States Patent
Yu et al.

(10) Patent No.: US 6,900,506 B1
(45) Date of Patent: May 31, 2005

(54) METHOD AND STRUCTURE FOR A HIGH VOLTAGE JUNCTION FIELD EFFECT TRANSISTOR

(75) Inventors: Ho-Yuan Yu, Saratoga, CA (US); Eric Johnson, Santa Clara, CA (US)

(73) Assignee: LovolTech, Inc., Santa Clara, CA (US)

( * ) Notice: Subject to any disclaimer, the term of this patent is extended or adjusted under 35 U.S.C. 154(b) by 332 days.

(21) Appl. No.: 10/117,019

(22) Filed: Apr. 4, 2002

(51) Int. Cl.[7] ............................................. H01L 29/76
(52) U.S. Cl. ................................... 257/409; 257/401
(58) Field of Search .......................... 257/134, 135, 257/168, 170, 173, 256, 270, 272, 274, 262, 287, 401, 409, 494, 495; 438/186, 140

(56) References Cited

U.S. PATENT DOCUMENTS

| | | | |
|---|---|---|---|
| 3,381,188 A | 4/1968 | Zuleeg et al. ............... | 317/235 |
| 4,404,575 A | 9/1983 | Nishizawa ................... | 357/22 |
| 4,419,586 A | 12/1983 | Phipps ....................... | 250/551 |
| 4,506,282 A | 3/1985 | Baliga ........................ | 357/43 |
| 4,519,024 A | 5/1985 | Federico et al. ............ | 363/127 |
| 4,523,111 A | 6/1985 | Baliga ........................ | 307/574 |
| 4,645,957 A | 2/1987 | Baliga ........................ | 307/570 |
| 4,700,461 A | 10/1987 | Choi et al. ................... | 437/41 |
| 4,750,023 A | 6/1988 | Shannon ..................... | 357/23.3 |
| 4,769,685 A | 9/1988 | MacIver et al. ............. | 357/23.4 |
| 4,853,561 A | 8/1989 | Gravrok ..................... | 307/443 |
| 5,038,266 A | 8/1991 | Callen et al. ................ | 363/89 |
| 5,396,085 A | 3/1995 | Baliga ........................ | 257/77 |
| 5,945,699 A | 8/1999 | Young ........................ | 257/256 |
| 6,011,703 A | 1/2000 | Boylan et al. .............. | 363/21 |
| 6,028,778 A | 2/2000 | Amano ....................... | 363/40 |
| 6,064,580 A | 5/2000 | Watanabe et al. ........... | 363/17 |
| 6,069,809 A | 5/2000 | Inoshita ...................... | 363/98 |
| 6,084,792 A | 7/2000 | Chen et al. ................. | 363/127 |
| 6,090,650 A | 7/2000 | Dabrai et al. ............... | 438/649 |
| 6,104,172 A | 8/2000 | Josephs et al. ............. | 323/222 |
| 6,180,519 B1 | 1/2001 | Kuroi et al. ................. | 438/649 |
| 6,236,257 B1 | 5/2001 | Si et al. ...................... | 327/379 |
| 6,251,716 B1 | 6/2001 | Yu .............................. | 438/186 |
| 6,307,223 B1 | 10/2001 | Yu .............................. | 257/256 |
| 6,404,157 B1 | 6/2002 | Simon ........................ | 318/445 |
| 6,439,678 B1 | 8/2002 | Norton ....................... | 347/9 |
| 2002/0024056 A1 * | 2/2002 | Miyakoshi et al. ......... | 257/144 |

OTHER PUBLICATIONS

Kang et al.; "A New Type of Transistor: CBT"; IEEE Transactions on Electron Devices; vol. 40; #10; Oct. 93.
"N–Channel Enhancement–Mode MOSFET Transistors"; 2N6660JAN/JANTX/JANTXV; Product Summary; Siliconix; P–37515–Rev. A, Jul. 04, 1994.
General Semiconductor; GF2208; "N–Channel Enhancement–Mode MOSFET"; Jul. 10, 2001.
International Rectifier; IRF1205; HEXFET Power MOSFET; Nov. 03, 1999.
"N–Channel 30V–0.034Ω–22A D2PAK StripFET Power MOSFET"; STB22NE03L: Preliminary Data; 6 pgs.; Nov. 2000.

(Continued)

*Primary Examiner*—Hoai Pham
*Assistant Examiner*—Nathan W. Ha
(74) *Attorney, Agent, or Firm*—Wagner, Murabito & Hao LLP

(57) ABSTRACT

A method for fabricating a junction field transistor for high-voltage applications. A lightly doped first epitaxial layer is formed on a highly doped substrate. A second epitaxial layer is deposited with a heavier dopant concentration than the first epitaxial layer. The second layer contains a control structure having a plurality of implanted gate regions and a source. A guard ring is formed to isolate the source and the control structure. The combination of the lightly doped first epitaxial layer and the guard ring enable the JFET to be operated with a breakdown voltage in excess of 100 volts. Multiple guard rings may be used to provide a breakdown voltage in excess of 150 volts.

20 Claims, 15 Drawing Sheets

OTHER PUBLICATIONS

"N–Channel Enhancement–Mode MOSFET Transistors"; 2N66601/VN88AFD; Product Summary; Siliconix; P–37655–Rev. B, Jul. 25, 1994.

Central Semiconductor Corp.; CMPF4391, CMPF4392 CMPF4393, N–Channel JFET; Product Summary.

Fairchild Semiconductor Corporation; "N–Channel/Logic Level Enhancement Mode Field Effect Transistor"; FDP6030L/FDB6030L; Apr. 1998.

Philips Semiconductors; "PowerMOS Transistor"; BUK463–60A/B; Product Specification; Jul. 1995.

\* cited by examiner

METHOD AND STRUCTURE FOR A HIGH VOLTAGE JUNCTION FIELD EFFECT TRANSISTOR

FIELD OF THE INVENTION

Embodiments of the present invention relate to the field of junction field effect transistors (JFETs). In particular, embodiments of the present invention relate to a high voltage JFET.

BACKGROUND ART

Junction field effect transistors (JFETs) are majority carrier devices that conduct current through a channel that is controlled by the application of a voltage to a p-n junction. JFETs may be constructed as p-channel or n-channel and may be operated as enhancement mode devices or depletion mode devices.

The most common JFET type is the depletion mode type. The depletion mode device is a normally "on" device that is turned off by reverse biasing the p-n junction so that pinch-off occurs in the conduction channel. P-channel depletion mode devices are turned off by the application of a positive voltage between the gate and source (positive $V_{gs}$), whereas n-channel depletion mode devices are turned off by the application of a negative voltage between the gate and source (negative $V_{gs}$). Since the junction of a depletion mode JFET is reverse biased in normal operation, the input voltage $V_{gs}$ can be relatively high. However, the supply voltage between the drain and source ($V_{ds}$) is usually relatively low.

Enhancement mode, or normally "off" JFETs are characterized by a channel that is sufficiently narrow such that a depletion region at zero applied voltage extends across the entire width of the channel. Application of a forward bias reduces the width of the depletion region in the channel, thereby creating a conduction path in the channel. P-channel enhancement mode JFETs are turned on by the application of a negative $V_{gs}$, and n-channel enhancement mode JFETs are turned on by the application of a positive $V_{gs}$. The input voltage of an enhancement mode JFET is limited by the forward breakdown voltage of the p-n junction.

Historically, high voltage applications for transistors have relied chiefly on bipolar junction transistors (BJTs), insulated gate bipolar transistors (IGBTs), and metal oxide semiconductor field effect transistors (MOSFETS). IGBTs and MOSFETs have the disadvantage of being susceptible to gate damage due to static discharge, and BJTs are susceptible to thermal runaway. JFETs do not have these disadvantages. JFETs share the transconductance/temperature behavior of MOSFETs, but they do not rely on an insulated gate. Another type of field effect transistor (FET) that does not rely on an insulated gate is the metal-semiconductor field effect transistor (MESFET).

Thus, a need exists for transistor that is capable of controlling high voltages without the limitations of static discharge sensitivity and susceptibility to thermal runaway.

SUMMARY OF INVENTION

A method for fabricating a junction field transistor for high-voltage applications is disclosed. A lightly doped first epitaxial layer is formed on a highly doped substrate. A second epitaxial layer is deposited with a heavier dopant concentration than the first epitaxial layer and a control structure having a plurality of implanted gate regions and a source. A guard ring is formed to isolate the source and the control structure. The combination of the lightly doped first epitaxial layer and the guard ring enable the JFET to be reliably operated with a breakdown voltage in excess of 100 volts.

In an embodiment of the present invention, a lightly doped epitaxial $N^-$ layer is deposited on an $N^+$ silicon substrate. A second nominally doped N epitaxial layer is then deposited on top of the lightly doped epitaxial $N^-$ layer. P+ gate regions are implanted in the second epitaxial layer and source contacts are provided by forming $N^+$ regions on a portion of the N epitaxial layer. The control structure resides within the second layer. The lightly doped first layer provides a drift region that increases the breakdown voltage between the drain and source and the drain and gate control structure. The top contacts and the bottom of the substrate are used as the source and drain contacts for the JFET.

In another embodiment of the present invention, A JFET is fabricated as described above, and a guard ring is provided to enhance the breakdown resistance of the device. The guard ring is formed by surrounding the control structure with P+ doped region that extends across the entire thickness of the N layer and into the $N^-$ layer. The width of the guard ring and the interface between the guard ring and the $N^-$ layer are designed to minimize the electric potential gradient and available charge carriers along paths other than the desired current path.

These and other objects and advantages of the present invention will no doubt become obvious to those of ordinary skill in the art after having read the followings detailed description of the preferred embodiments which are illustrated in the various drawing figures.

DESCRIPTION OF THE PREFERRED EMBODIMENTS

In the following detailed description of the present invention, a high voltage junction field effect transistor (JFET) structure and a method for fabricating the structure; numerous specific details are set forth in order to provide a thorough understanding of the present invention. However, it will be obvious to one skilled in the art that the present invention may be practiced without these specific details. In other instances well known methods involving deposition, photolithography, etch, etc., and well known structures such as ohmic contacts, barrier metallization, etc., have not been described in detail so as not to unnecessarily obscure aspects of the present invention.

U.S. Pat. No. 6,251,716 entitled "JFET Structure and Manufacture Method for Low On-Resistance and Low Voltage Application," issued Jun. 26, 2001, and assigned to the assignee of the present invention, is hereby incorporated herein by reference.

Figure 1:
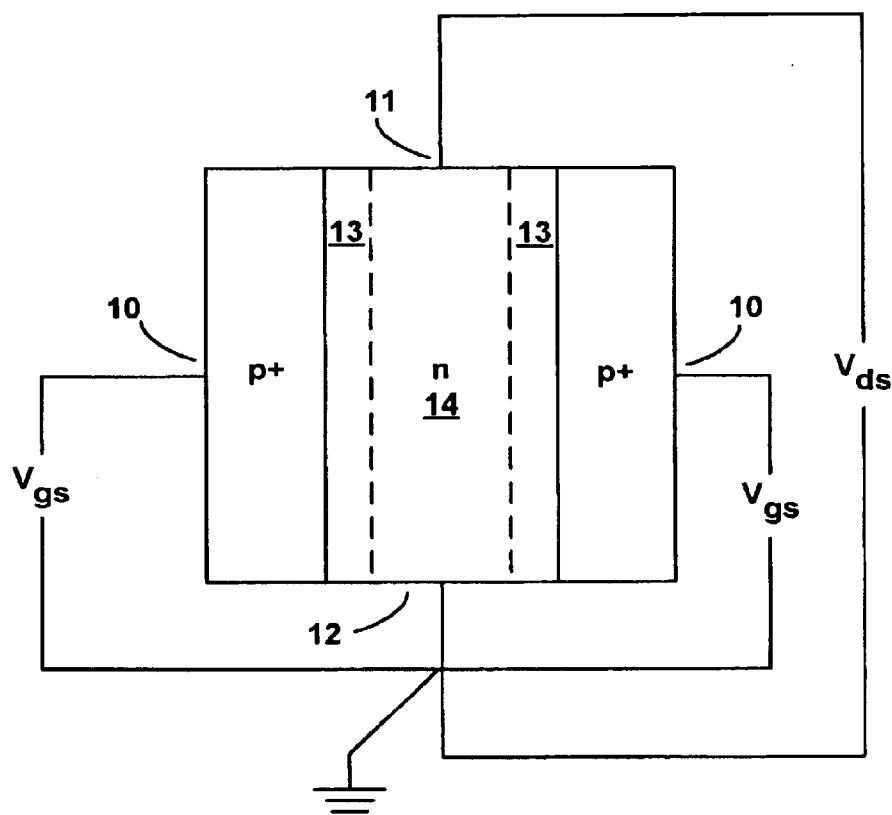
FIG. 1 shows a general schematic for an n-channel depletion mode junction field effect transistor (JFET).

FIG. 1 shows a general schematic for an n-channel depletion mode JFET with $V_{gs}=V_{ds}=0$. The JFET has two opposed gate regions 10, a drain 11 and source 12. The drain 11 and source 12 are located in the n-doped region of the device and the gates 10 are p-doped. Two p-n junctions are present in the device, each having an associated depletion region 13. A conductive channel region 14 is shown between the two depletion regions 13 associated with the p-n junctions. In operation, the voltage variable width of the depletion regions 13 is used to control the effective cross-sectional area the of conductive channel region 14. The application of a voltage $V_{gs}$ between the gates 10 and source 12 will cause the conductive channel region to vary in width, thereby controlling the resistance between the drain 11 and the source 12. A reverse bias, (e.g., a negative $V_{gs}$), will cause the depletion regions to expand, and at a sufficiently negative value cause the conductive channel to "pinch off", thereby turning off the device.

The width of the depletion regions 13 and the conductive channel region 14 are determined by the width of the n-doped region and the dopant levels in the n-doped and p-doped regions. If the device shown in FIG. 1 were constructed with a narrow n-doped region, such that the two depletion regions merged into a single continuous depletion region and the conductive channel region 14 had zero width, the result would be the device shown in FIG. 2.

Figure 2:
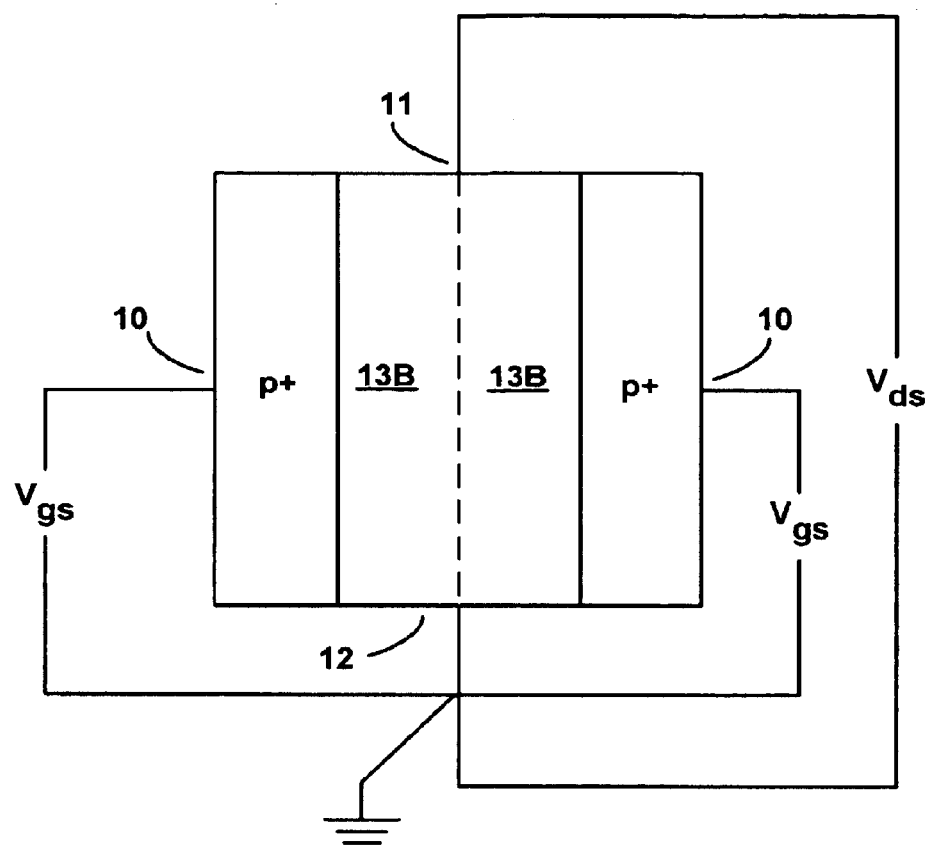
FIG. 2 shows a general schematic for an n-channel enhancement mode junction field effect transistor (JFET).

FIG. 2 shows a general schematic of an n-channel enhancement mode JFET with $V_{gs}=V_{ds}=0$. The enhancement mode device is normally "off" since the conductive channel width is zero due to the extent of the two depletion regions 13B. The application of a sufficient forward bias (e.g. positive $V_{gs}$) to the device of FIG. 1B will cause the depletion regions 13B to contract, thereby opening a conductive channel.

Although the depletion mode and enhancement mode devices shown schematically in FIG. 1 and FIG. 2 are n-channel devices, depletion mode and enhancement mode devices could be constructed with a reversed doping scheme to provide p-channel devices.

Figure 3A:
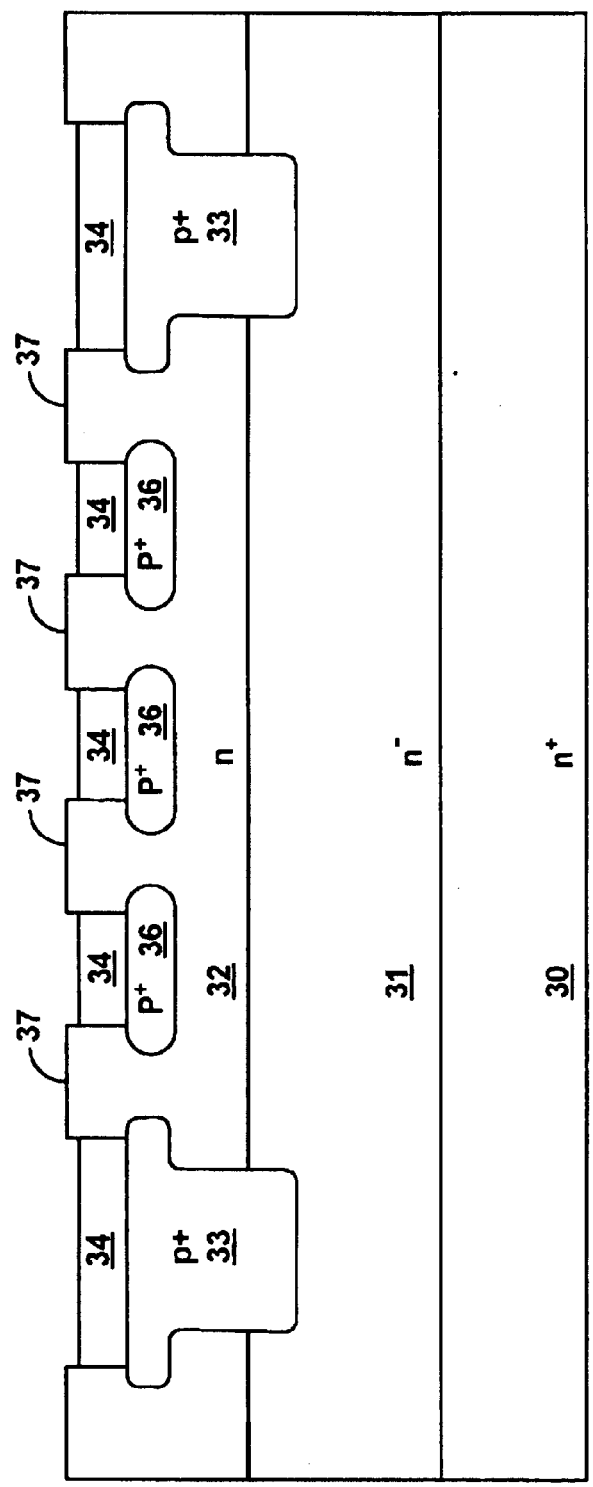
FIG. 3A shows a cross-section of an n-channel JFET structure with a guard ring for high voltage applications in accordance with an embodiment of the present claimed invention.

FIG. 3A shows a cross-section of an n-channel JFET structure for high voltage applications. In this particular example, A heavily doped N+ substrate 30 with a specific resistivity of between 0.002 and 0.010 ohm-cm has an adjacent lightly doped N− layer 31. The N− layer 31 is preferably deposited as an epitaxial film, but may be produced by adjusting the dopant concentration in the N+ substrate 30. The N− layer 31 has a lower dopant concentration than the substrate 30.

The thickness of the N− layer 31 is preferably between 0.5 and 20.0 microns. The specific resistivity of the N− layer 31 is preferably between 0.5 ohm-cm and 20 ohm-cm.

The N− layer 31 has an adjacent nominally doped N layer 32. The N layer 32 has a higher dopant concentration than the N− layer 31 and a lower dopant concentration than the substrate 30. The preferred thickness of the N layer 32 is less than 2.0 microns, and the preferred specific resistivity is between 0.1 and 2.0 ohm-cm. The gate control structure of the JFET resides in the N layer 32.

The control structure comprises the gate regions 36. The gate regions 36 are P+ doped and are preferably formed by ion implantation. The gate regions 36 are electrically coupled to each other. The regions of the N layer immediately adjacent to the source contacts 37 are collectively referred to as the source of the control structure. Although from a circuit standpoint, either contact may serve as drain or source, the asymmetry of the JFET structure results in performance characteristics that are dependent upon the selection of the drain and source. The source contacts 37 are thin N+ regions for accepting contact metallization. The bottom surface of the substrate 30 serves as the drain contact.

There is a wide range of geometries that may be applied to the implementation of the gate regions 36 and the source contacts 37 within the volume of the N layer 32. The shape and separation of the gate regions 36 will be dependent upon whether the device is an enhancement mode device or a depletion mode device, and other design considerations.

The source and the control structure are physically and electrically isolated by the guard ring 33. Within the JFET, the portion of the N layer 32 that contains the source regions and the control structure are separated from the remaining portion of the N layer 32. Thus, the N layer portion containing the source and control structure is bounded by either the N− layer or the guard ring 33. The guard ring 33 surrounds the source and the control structure and extends into the N− layer. The preferred depth of penetration of the guard ring 33 into the N− layer 31 is about one half of the thickness of the N− layer 31 or less. As shown in FIG. 3A, the guard ring is P+ type material. The guard ring 33 and gate regions 36 are recessed and covered by fill oxide 34.

Figure 3B:
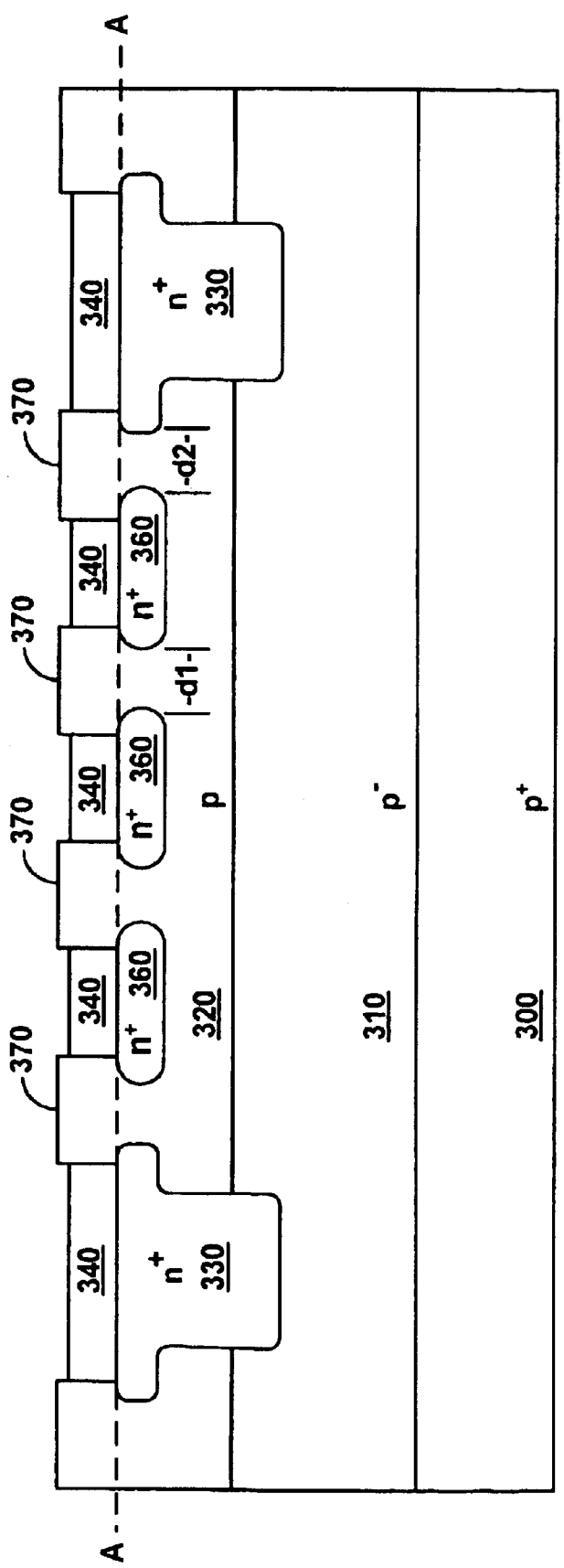
FIG. 3B shows a cross-section of a p-channel JFET structure with a guard ring for high voltage applications in accordance with an embodiment of the present claimed invention.

FIG. 3B shows a p-channel JFET device that has a structure similar to that of FIG. 3A. A P+ substrate 300 supports a P− layer 310 that in turn supports a P layer 320. A control structure having N+ doped gate regions 360 resides within the P layer 320. The source regions and the control structure are isolated by a guard ring 330. The guard ring 330 and gate regions 360 are recessed and covered by fill oxide 340. The JFET structure of FIG. 3B is complementary to the JFET structure of FIG. 3A in that the doping scheme is reversed.

The guard ring shown FIG. 3A and FIG. 3B is generally isolated from the control structure and floats with respect to the voltages of the drain, source and gate of the JFET, but may be coupled to a voltage (e.g., the gate). A guard ring that is coupled to a voltage source so that its associated p-n junction may be controlled is referred to as an active guard ring. In the JFET of FIG. 3B, the distance d1 between adjacent gate regions 360 will have a channel that will be controlled by a depletion region extending from each of the gate regions since the gate regions are electrically coupled to each other. The guard ring 330 is separated from an adjacent gate region 360 by a distance d2. The distance d2 may or may not be equal to the distance d1, depending upon the relative potential of the guard ring 330 and the gate region 360. For a floating guard ring, d2 will generally be less than d1, since only the depletion region associated with the gate region is being modulated.

For an enhancement mode device with a floating guard ring, d2 will be approximately one half of d1, so that the depletion region from the gate region effectively cuts off the channel with zero gate voltage. Alternatively, contact to the source region 370 adjacent to the guard ring may be eliminated. In either case, the source and channel adjacent to a floating guard ring must be addressed in order to insure the off state of the device.

An enhancement mode device that has an active guard ring may have a d2 that is not less than d1. For example, the guard ring may be coupled to the gate so that the channel behavior between the gate and guard ring is the same as that between gate regions. The coupling of the guard ring and gate has the potential disadvantage of breakdown under forward bias conditions. To prevent breakdown in a device in which the gate may be forward biased, an active guard ring may be connected to an independent voltage source that ensures a reverse bias, regardless of the gate voltage.

The guard ring used in a depletion mode device may or may not be active. Although the relationship of d1 and d2 are generally not as critical in a depletion mode device, it will influence the turn off behavior and the on resistance.

Figure 4A:
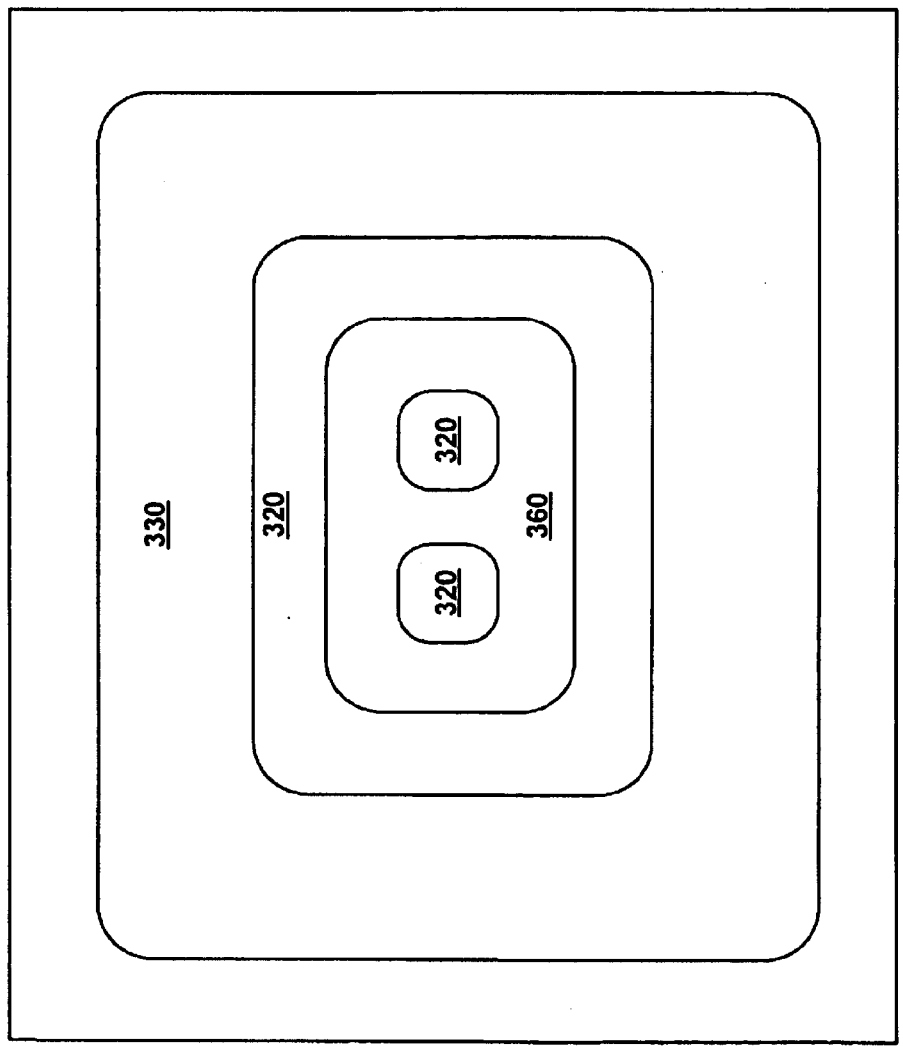
FIG. 4A shows a top view of a JFET structure with a guard ring prior to oxide deposition in accordance with an embodiment of the present claimed invention.

FIG. 4A shows a top view of a JFET structure with a guard ring prior to oxide deposition. This view is the section A—A of FIG. 3B. The guard ring surrounds the gate control structure 360 and the source regions of the N-layer 320 that are adjacent to the gate control structure 360.

Figure 4B:
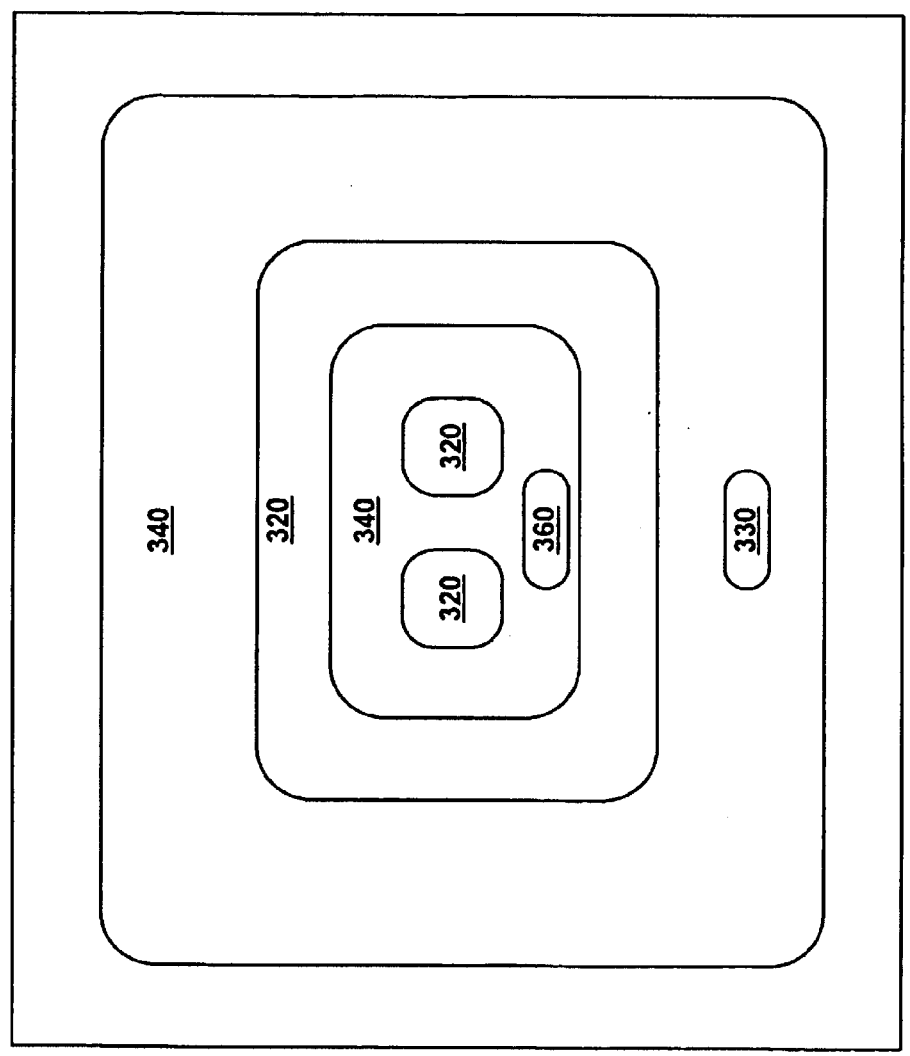
FIG. 4B shows a top view of a JFET structure having a guard ring with deposited oxide and vias in accordance with an embodiment of the present claimed invention.

FIG. 4B shows a top view of a JFET structure having a guard ring with deposited oxide and vias through the oxide for contact to the gate control structure 360 and guard ring 330. The via 360 would generally be required for an active guard ring, and may not be present in a device using a floating guard ring. The oxide 340 provides insulation between the gate, guard ring and source.

Figure 4C:
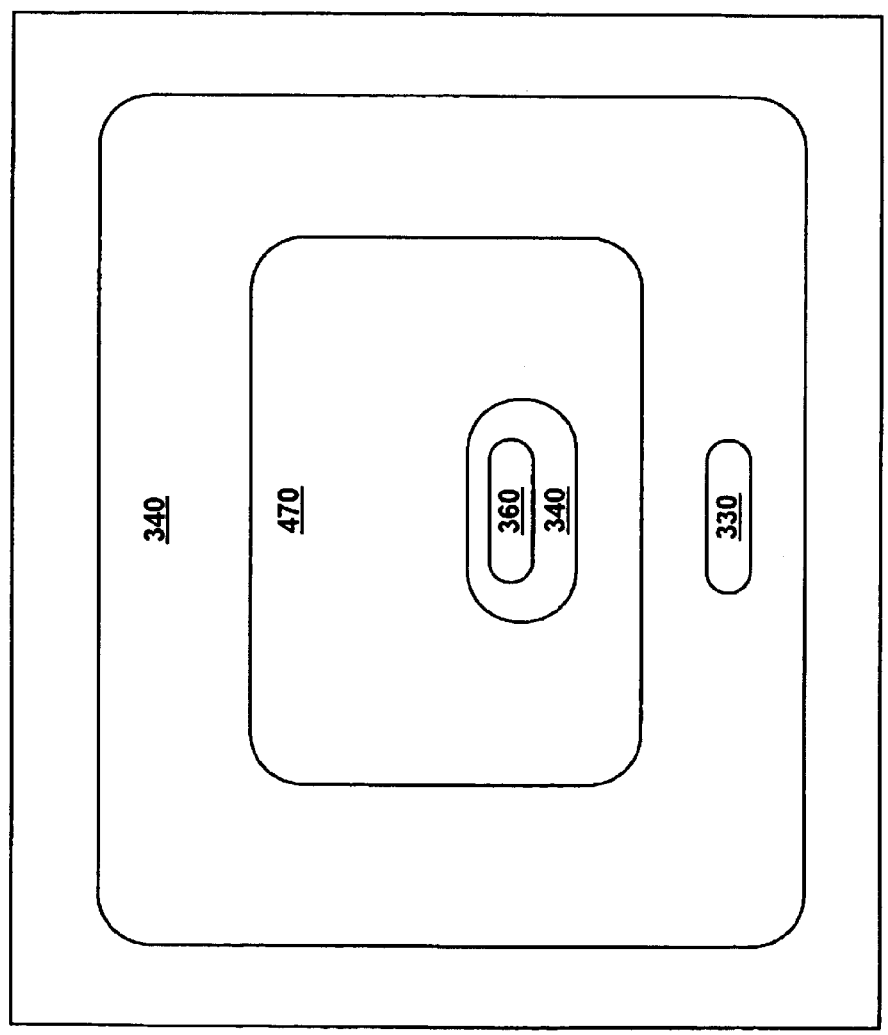
FIG. 4C shows a top view of a JFET structure having a guard ring with deposited source contact metal in accordance with an embodiment of the present claimed invention.

FIG. 4C shows a top view of a JFET structure of FIG. 4B with deposited source contact metal in accordance with an embodiment of the present claimed invention. In general, the area devoted to source contact metallization will be greater than that devoted to gate or guard ring contact metal since the source current is typically much larger than the gate or active guard ring currents. The overall scheme for contact metal will depend upon the operating potentials and the contact current loads.

Figure 5:
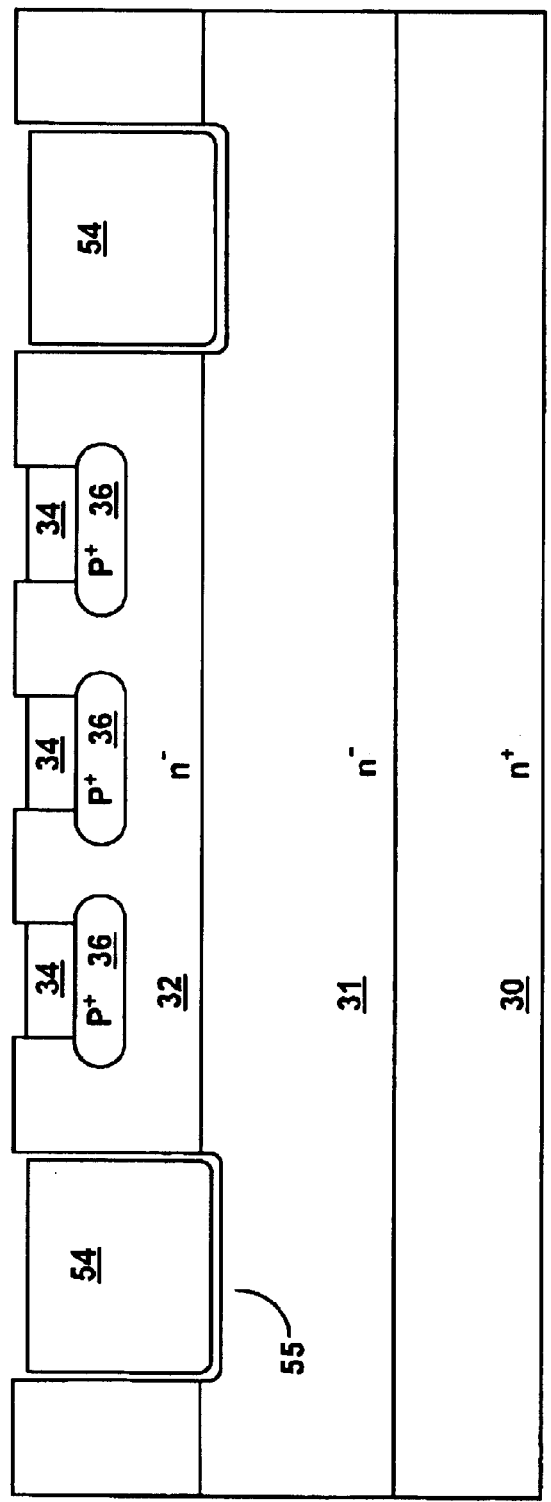
FIG. 5 shows a cross-section of a JFET structure with a passive guard ring in accordance with an embodiment of the present claimed invention.

FIG. 5 shows a JFET structure similar to that of FIG. 3A, with the exception of the guard ring. The guard ring 54 shown in FIG. 5 is a passive guard ring and is fabricated from a dielectric material, e.g., silicon dioxide or silicon nitride. Since the interface between a semiconductor and a dielectric may have accumulated or trapped charges that may adversely affect the breakdown voltage of a device, an interfacial layer 55 may be required to reduce the trapping of charges. For a passive guard ring fabricated from silicon dioxide on silicon, a polysilicon film with a thickness of 50 to 100 angstroms may be used for the interfacial layer 55.

Figure 6:
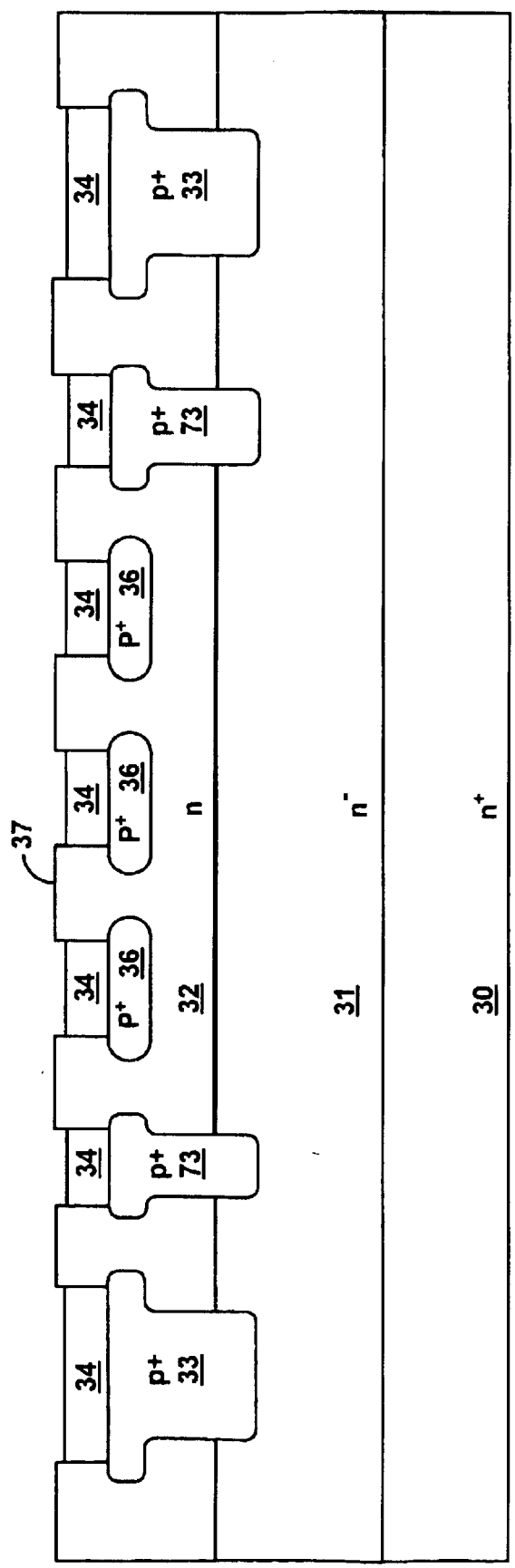
FIG. 6 shows a cross-section of a JFET having two guard rings in accordance with an embodiment of the present claimed invention.

FIG. 6 shows a JFET structure having multiple guard rings 33 and 73. Multiple guard rings are preferred in devices with a $V_{ds}$ greater than 150 volts. Below 150 volts, a single guard ring is generally adequate. When multiple guard rings are used, floating, active or passive guard rings may be used in combination.

Figure 7A:
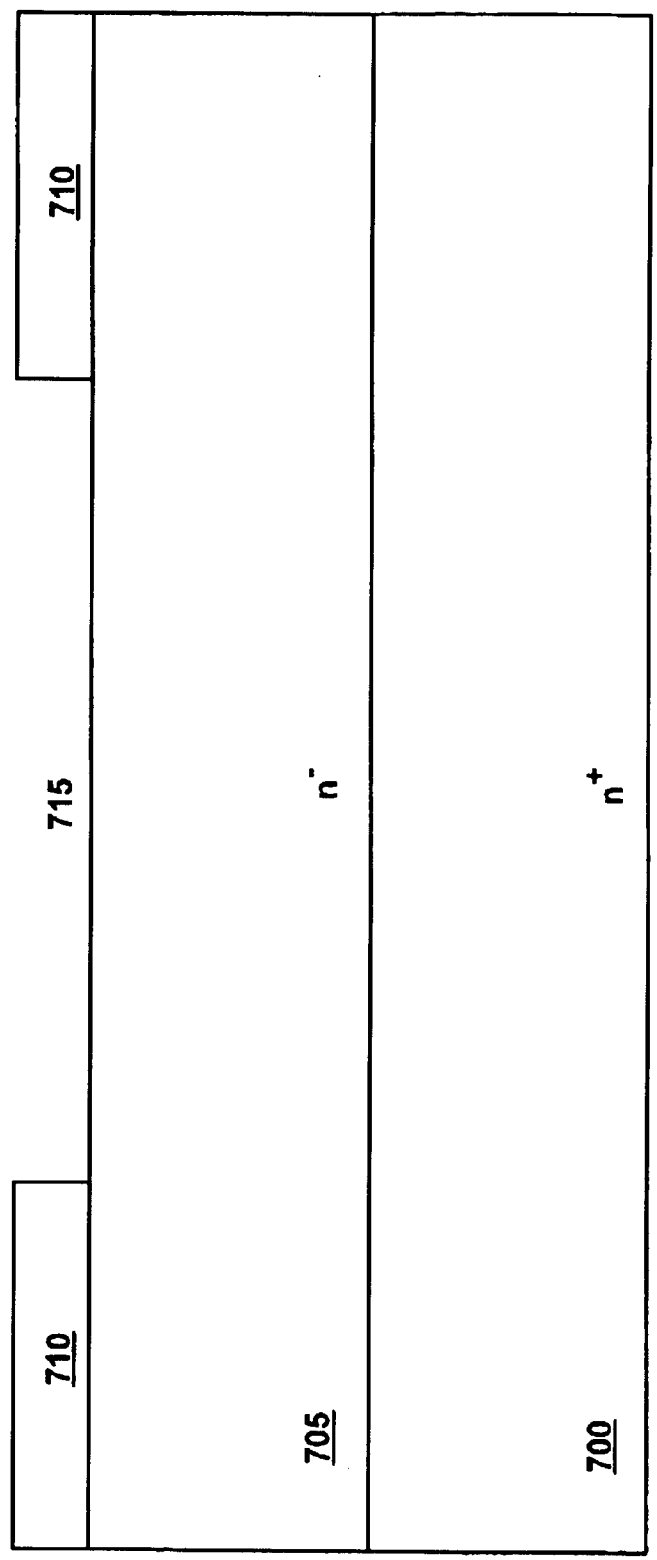
FIG. 7A shows a $N^+$ substrate with an $N^-$ epitaxial layer prior to guard ring formation in accordance with an embodiment of the present claimed invention.

FIG. 7A shows a heavily doped N$^+$ substrate 700 with a lightly doped N$^-$ epitaxial layer 705 prior to guard ring formation. The surface of the substrate has a photoresist mask 710 with a window 715 that defines an area to be ion implanted.

Figure 7B:
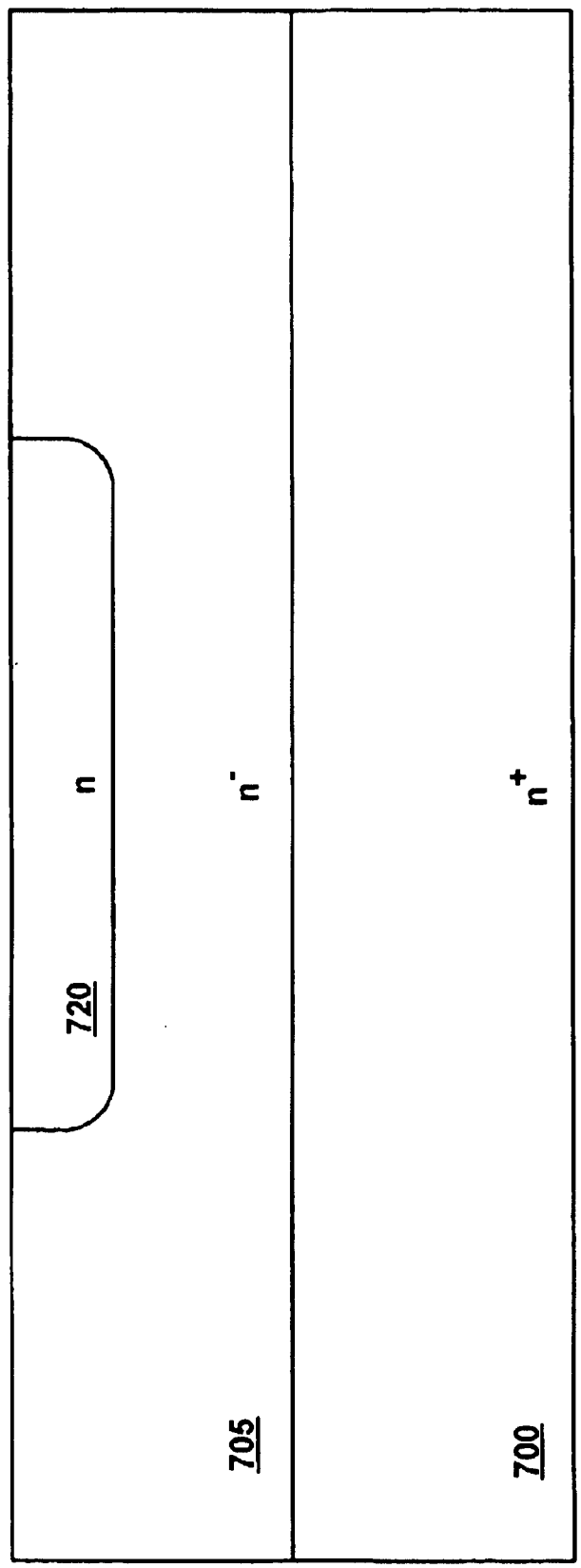
FIG. 7B shows the substrate of FIG. 7A with a moderately doped N region implant prior to guard ring formation in accordance with an embodiment of the present claimed invention.

FIG. 7B shows the substrate of FIG. 7A with a moderately doped N region 720. The N region 720 is produced by ion implantation through the window 715 of FIG. 7A, followed by an anneal. In this example, the implant is an n-type species such as phosphorus.

Figure 7C:
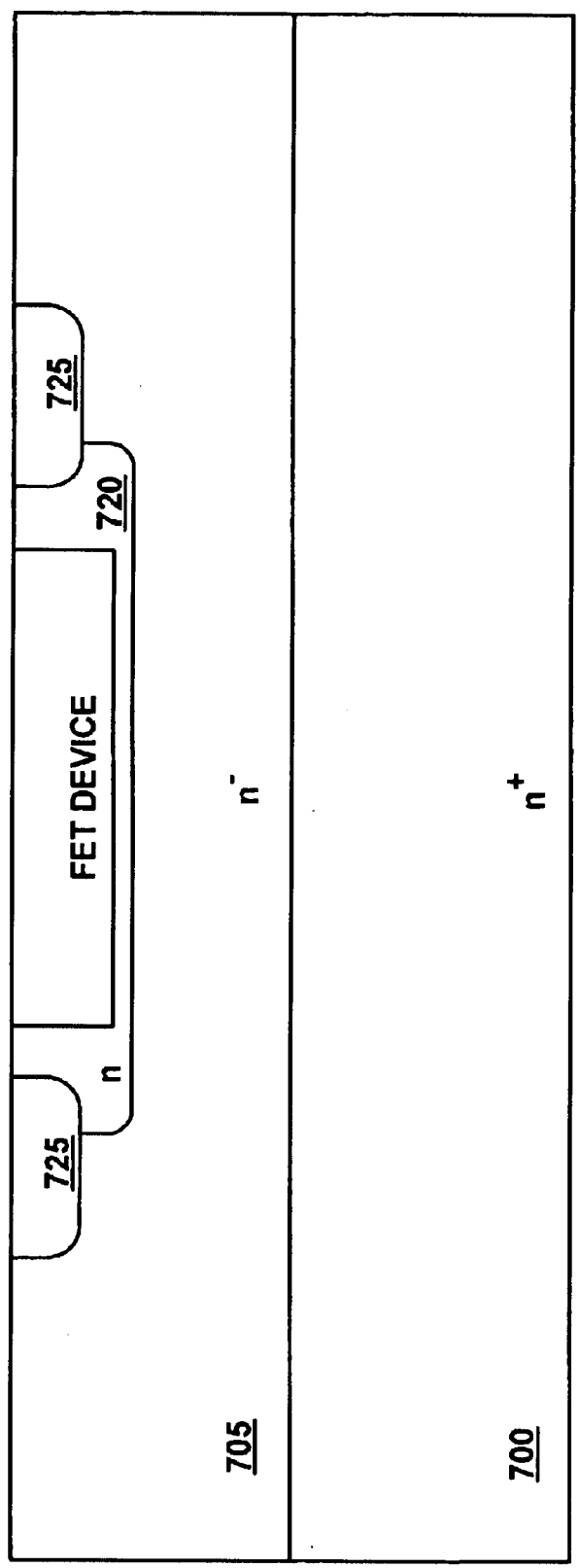
FIG. 7C shows the substrate of FIG. 7B with a guard ring and FET device in accordance with an embodiment of the present claimed invention.

FIG. 7C shows the substrate of FIG. 7B with a guard ring 725 and FET device in the well 720. The FET device (e.g., JFET or MESFET) is fabricated within the N region 720. The guard ring 725 is situated on the boundary between the N region 720 and the N$^-$ epitaxial layer 705. Since a portion of the guard ring extends laterally into the N$^-$ epitaxial layer 705, a higher breakdown voltage is achieved without having to fabricate a deep trench through the N region 720. The depth of the trench used for the guard ring 725 may be of the same order as the trench used for the control gate of the FET device, thus avoiding the effort and expense of creating deeper trenches for the guard ring.

Figure 8A:
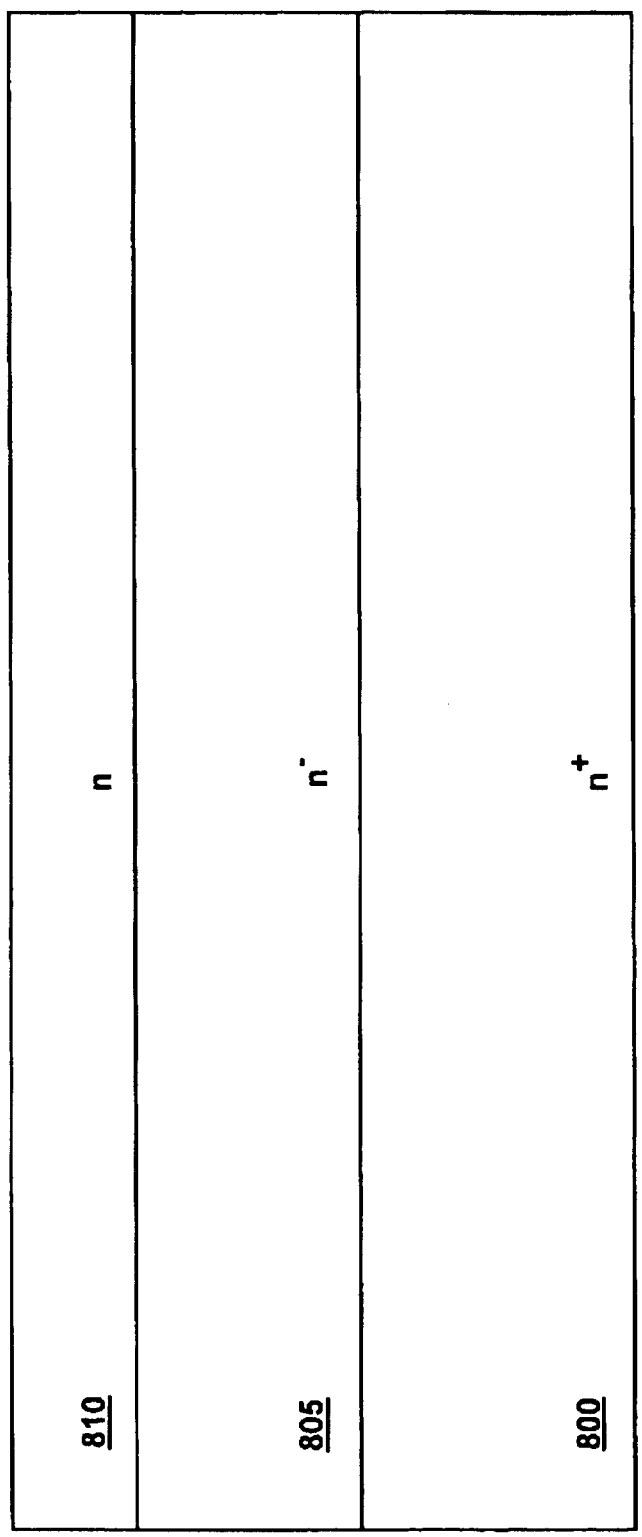
FIG. 8A shows a N+ substrate with an N− and N epitaxial layers prior to guard ring formation in accordance with an embodiment of the present claimed invention.
Figure 8B:
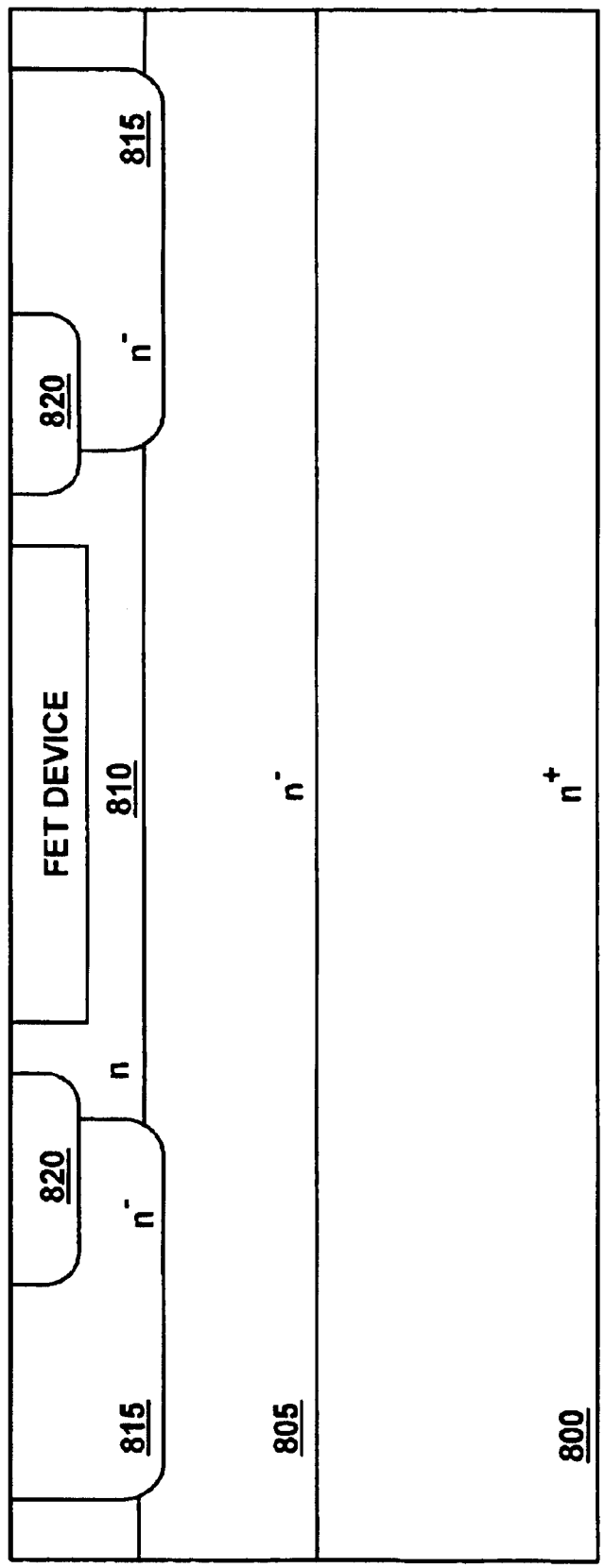
FIG. 8B shows a the substrate of FIG. 8A with a guard ring and FET device in accordance with an embodiment of the present claimed invention.

FIG. 8A shows a N$^+$ substrate 800 with a lightly doped epitaxial N$^-$ layer 805 and a moderately doped epitaxial N layer 810 prior to guard ring formation. As shown in FIG. 8B, An N$^-$ region 815 with a dopant concentration that is approximately equal to the dopant concentration of N$^-$ layer 805 is created within the N layer 810 by mask, implant with a counter doping species (e.g., boron), and anneal. A shallow guard ring 820 is fabricated on the boundary between the N$^-$ region 815 and the N layer 810. The guard ring 820 and the N$^-$ region 815 create an "island" portion of the N layer 810 in which a FET device (e.g., JFET or MESFET) is fabricated.

Figure 9:
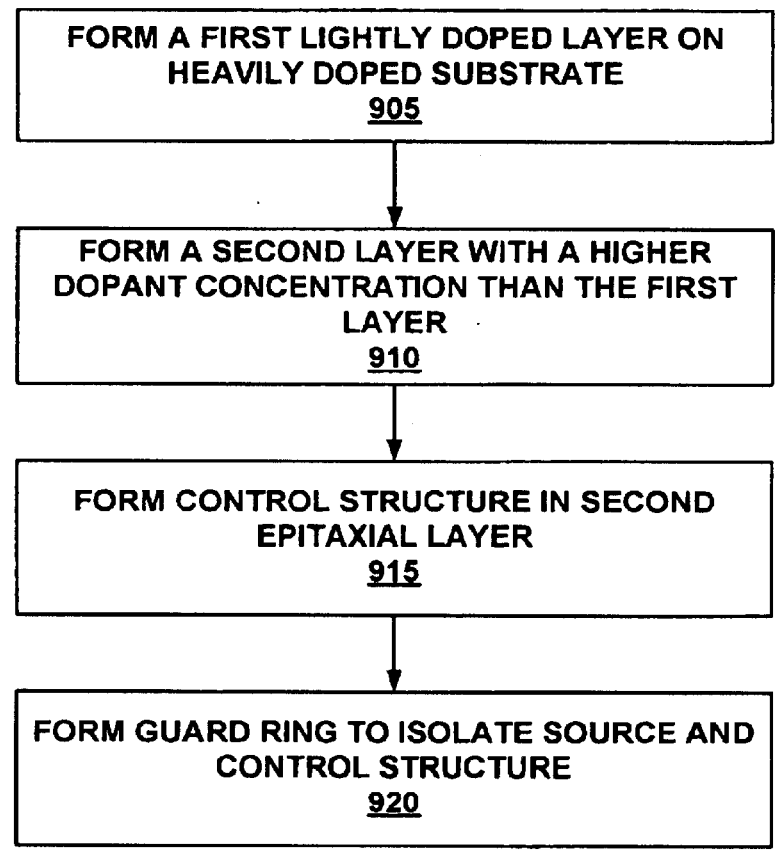
FIG. 9 shows a flow chart for a method embodiment of the present claimed invention.

FIG. 9 shows a flow chart 900 for a method of fabricating a high voltage JFET in accordance with an embodiment of the present invention.

In step 905, a first lightly doped epitaxial layer is formed on a heavily doped substrate. This layer is preferably deposited as an epitaxial layer, but may also be formed by implant and anneal, or-diffusion. The heavily doped substrate serves as the nominal drain connection for the JFET being fabricated.

In step 910, a second layer having a higher dopant concentration than the first epitaxial layer is formed on the first layer. This layer is preferably deposited as an epitaxial layer, but may also be formed by implant and anneal, or diffusion.

In step 915 a control structure is formed in the second layer by implanting gate regions in the second a source is produced comprising regions sharing a p-n junction with the gate regions.

In step 920 a guard ring is formed to isolate the source and the control structure. More than one guard ring may be formed and the guard ring(s) may be floating, active or passive. The first guard ring formed effectively divides the second layer into two regions, with one region containing the source and control structure. Additional guard rings effectively subdivide the portion of the second layer that does not contain the source and control structure.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A semiconductor device comprising:
   a heavily doped $N^+$ substrate;
   a lightly doped $N^-$ epitaxial layer disposed on said $N^+$ substrate;
   a moderately doped N epitaxial layer disposed on the surface of said lightly doped $N^-$ epitaxial layer;
   a lightly doped $N^-$ region disposed in said moderately doped N epitaxial layer wherein said lightly doped $N^-$ region surrounds a portion of said moderately doped N epitaxial layer;
   a field effect transistor (FET) device disposed in said portion of said moderately doped N epitaxial layer; and,
   a guard ring situated on the boundary between said portion of said moderately doped N epitaxial layer and said lightly doped $N^-$ region.

2. The semiconductor device of claim 1, further comprising a metal-semiconductor field effect transistor (MESFET).

3. The semiconductor device of claim 1, further comprising a junction field effect transistor (JFET).

4. The semiconductor device of claim 1, wherein said N layer has a resistivity between 0.1 ohm-cm and 2.0 ohm-cm.

5. The semiconductor device of claim 1, wherein said $N^-$ layer has a resistivity between 0.5 ohm-cm and 20.0 ohm-cm.

6. The semiconductor device of claim 1, wherein said $N^+$ layer has a resistivity between 0.002 ohm-cm and 0.010 ohm-cm.

7. The semiconductor device of claim 1, wherein said N layer has a thickness of less than 2.0 microns.

8. The semiconductor device of claim 1, wherein said $N^-$ layer has a thickness between 0.5 microns and 20.0 microns.

9. A semiconductor device comprising:
   a heavily doped $N^+$ substrate;
   a lightly doped $N^-$ epitaxial layer disposed on said $N^+$ substrate;
   a moderately doped N epitaxial layer disposed on the surface of said lightly doped $N^-$ epitaxial layer;
   a lightly doped $N^-$ region disposed in said moderately doped N epitaxial layer wherein said lightly doped $N^-$ region surrounds a portion of said moderately doped N epitaxial layer;
   a junction field effect transistor (JFET) device disposed in said portion of said moderately doped N epitaxial layer; and,
   a guard ring situated on and above the boundary between said portion of said moderately doped N epitaxial layer and said lightly doped $N^-$ region.

10. The semiconductor device of claim 9, wherein said N layer has a resistivity between 0.1 ohm-cm and 2.0 ohm-cm.

11. The semiconductor device of claim 9, wherein said $N^-$ layer has a resistivity between 0.5 ohm-cm and 20.0 ohm-cm.

12. The semiconductor device of claim 9, wherein said $N^+$ layer has a resistivity between 0.002 ohm-cm and 0.010 ohm-cm.

13. The semiconductor device of claim 9, wherein said N layer has a thickness of less than 2.0 microns.

14. The semiconductor device of claim 9, wherein said $N^-$ layer has a thickness between 0.5 microns and 20.0 microns.

15. A semiconductor device comprising:
   a heavily doped $N^+$ substrate;
   a lightly doped $N^-$ epitaxial layer disposed on said $N^+$ substrate;
   a moderately doped N epitaxial layer disposed on the surface of said lightly doped $N^-$ epitaxial layer;
   a lightly doped $N^-$ region disposed in said moderately doped N epitaxial layer wherein said lightly doped $N^-$ region surrounds a portion of said moderately doped N epitaxial layer;
   a metal-semiconductor field effect transistor (MESFET) device disposed in said portion of said moderately doped N epitaxial layer; and,
   a guard ring situated on and above the boundary between said portion of said moderately doped N epitaxial layer and said lightly doped $N^-$ region.

16. The semiconductor device of claim 15, wherein said N layer has a resistivity between 0.1 ohm-cm and 2.0 ohm-cm.

17. The semiconductor device of claim 15, wherein said $N^-$ layer has a resistivity between 0.5 ohm-cm and 20.0 ohm-cm.

18. The semiconductor device of claim 15, wherein said $N^+$ layer has a resistivity between 0.002 ohm-cm and 0.010 ohm-cm.

19. The semiconductor device of claim 15, wherein said N layer has a thickness of less than 2.0 microns.

20. The semiconductor device of claim 15, wherein said $N^-$ layer has a thickness between 0.5 microns and 20.0 microns.

* * * * *